United States Patent [19]

Beitner

[11] 4,383,414
[45] May 17, 1983

[54] PELTIER REFRIGERATION CONSTRUCTION

[75] Inventor: Shlomo Beitner, Tel-Aviv, Israel

[73] Assignee: Bipol Ltd., Tel-Aviv, Israel

[21] Appl. No.: 316,882

[22] Filed: Oct. 30, 1981

[51] Int. Cl.$^3$ ............................................. F25B 21/02
[52] U.S. Cl. ......................................................... 62/3
[58] Field of Search ............................................. 62/3

[56] References Cited

U.S. PATENT DOCUMENTS

| | | | |
|---|---|---|---|
| 3,177,671 | 4/1965 | Stambaugh | 62/3 |
| 3,195,315 | 7/1965 | Boehmer et al. | 62/3 |
| 3,232,063 | 2/1966 | Eichhorn et al. | 62/3 |
| 3,307,365 | 3/1967 | Townsend | 62/3 |
| 4,297,850 | 11/1981 | Reed | 62/3 |
| 4,326,383 | 4/1982 | Reed et al. | 62/3 |

*Primary Examiner*—Lloyd L. King
*Attorney, Agent, or Firm*—Gordon W. Hueschen

[57] ABSTRACT

There is disclosed a refrigeration unit having a box-like compartment surrounded by insulation material. The ends of the box-like compartment and the top and bottom thereof are composed of massive plates having a plurality of protuberances extending through the insulation and terminating in flat faces. Thermoelectric elements are in heat exchange with the flat faces and with external thermal sinks or radiating devices. The unit has upstanding frame members which form shallow compartments which house the radiating devices and are covered by grill work. One of the shallow compartments houses the door or closure to the refrigerating compartment. The frame members extend downwardly forming legs. The insulation has a skin of dense material having contact points extending from electrical wires in the insulation to the surface thereof and from which contact points are connected to the thermoelectric elements. A resilient gasket surrounds each thermoelectric element and extends over the contact points thereby providing a completely water-tight structure.

34 Claims, 10 Drawing Figures

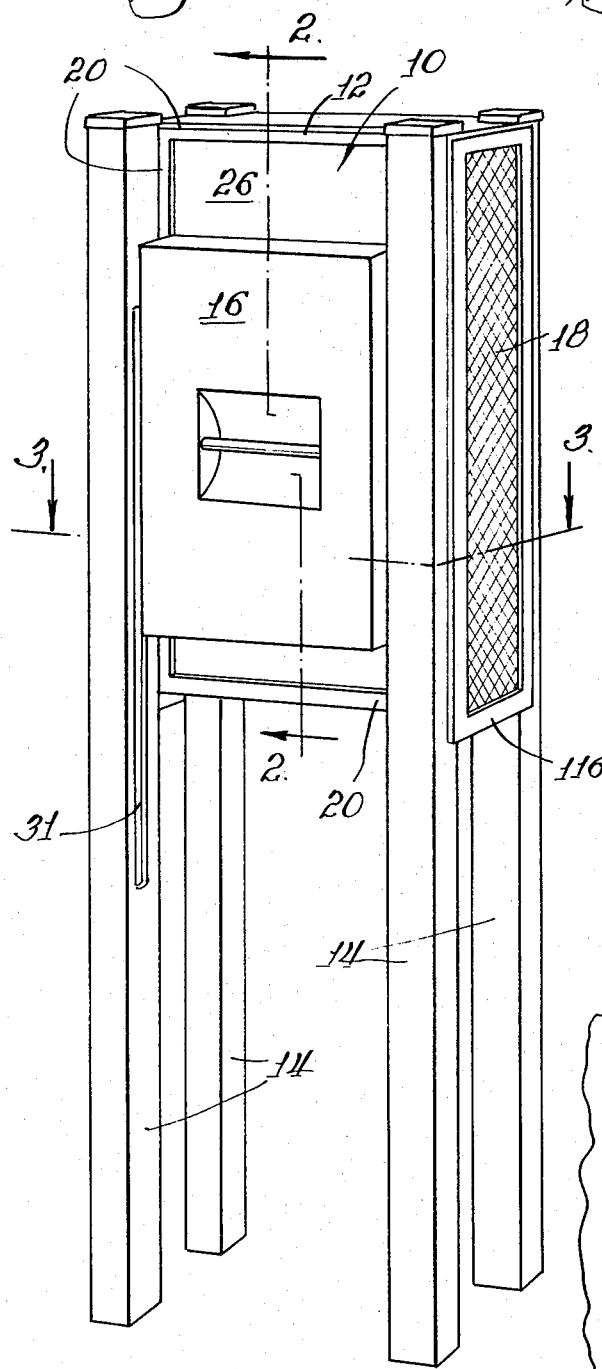
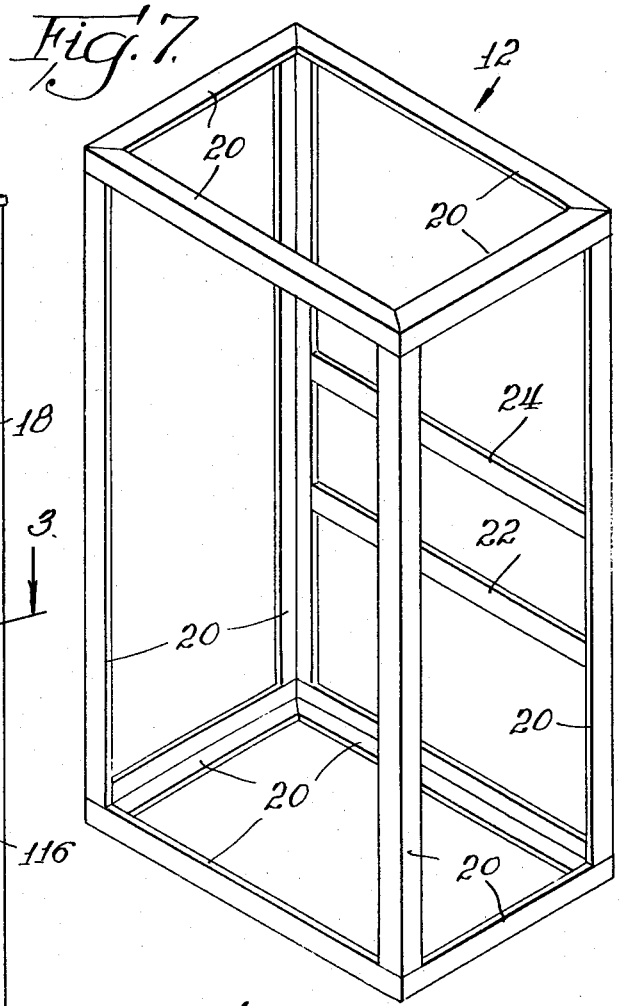
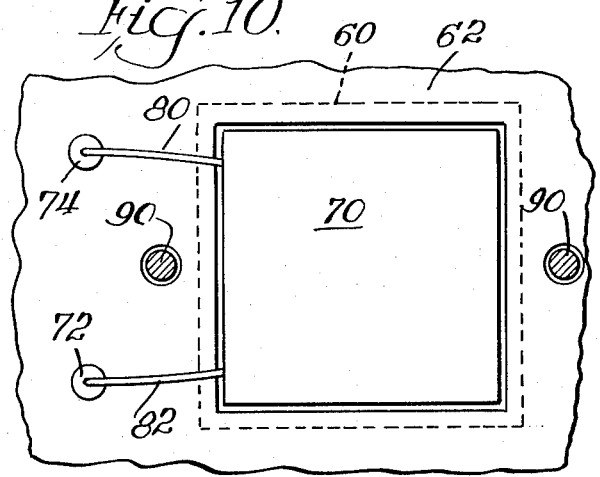
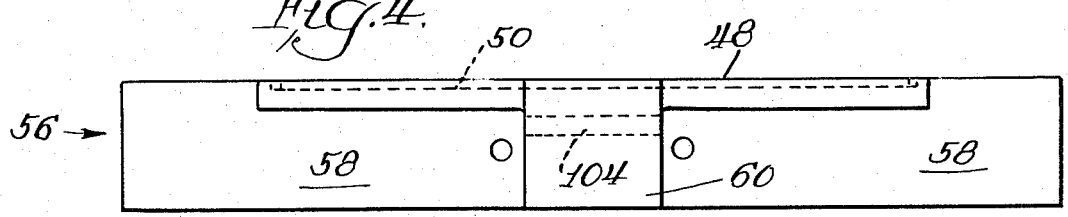

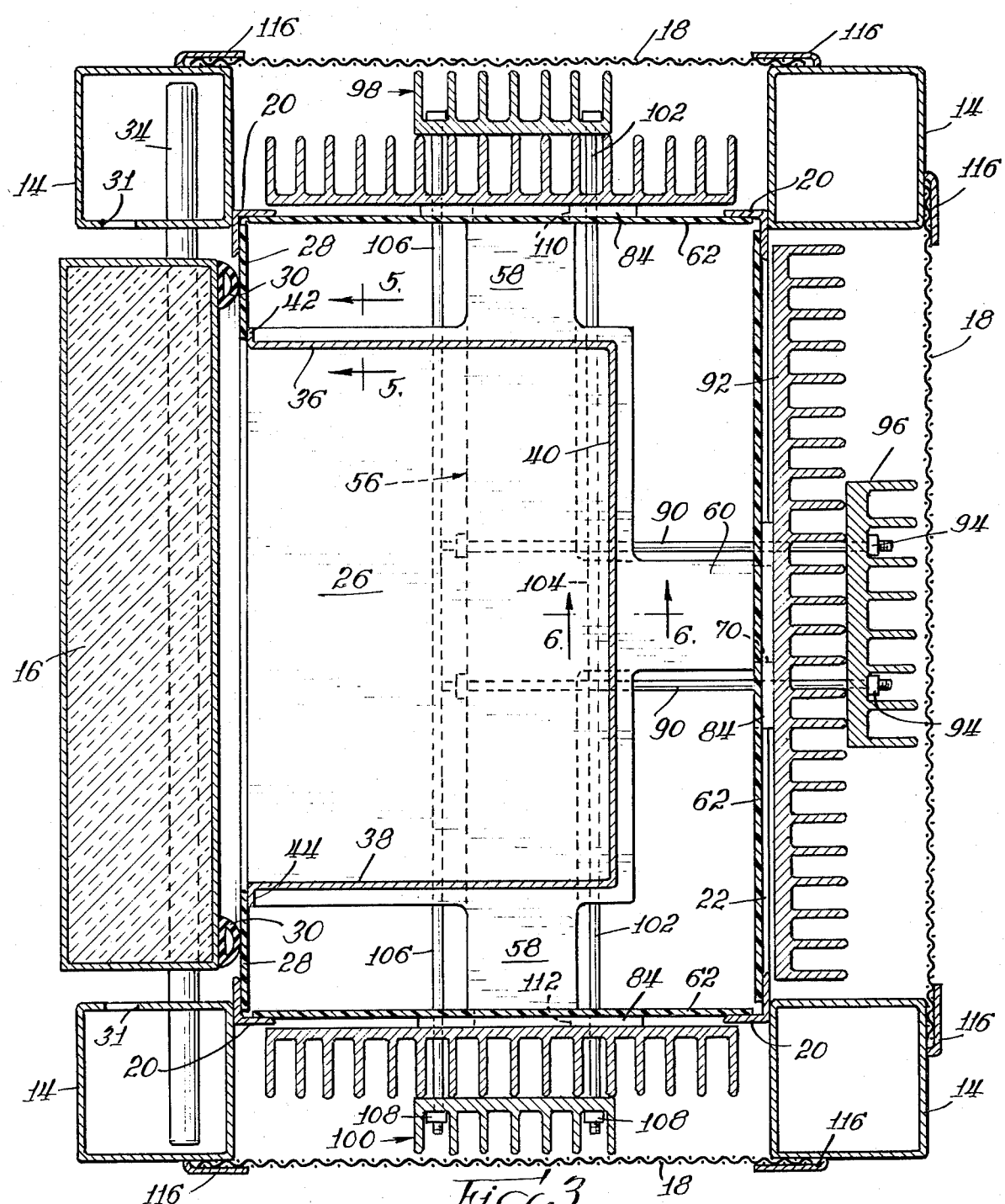
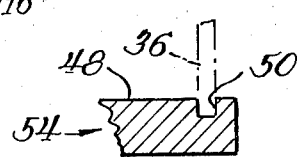
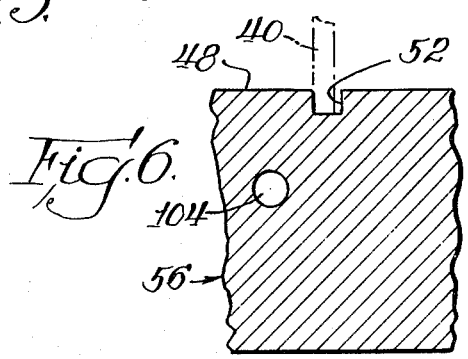

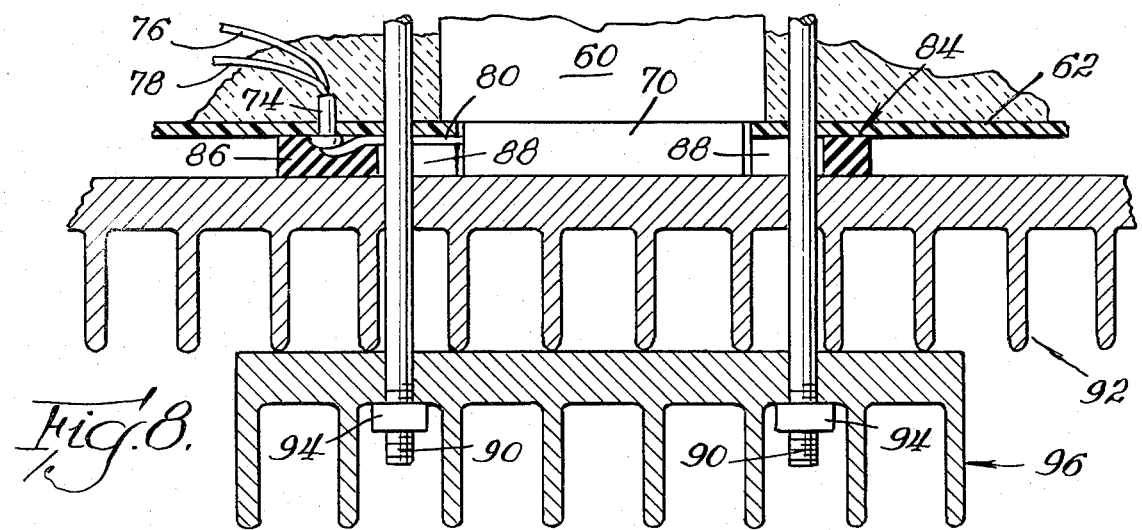
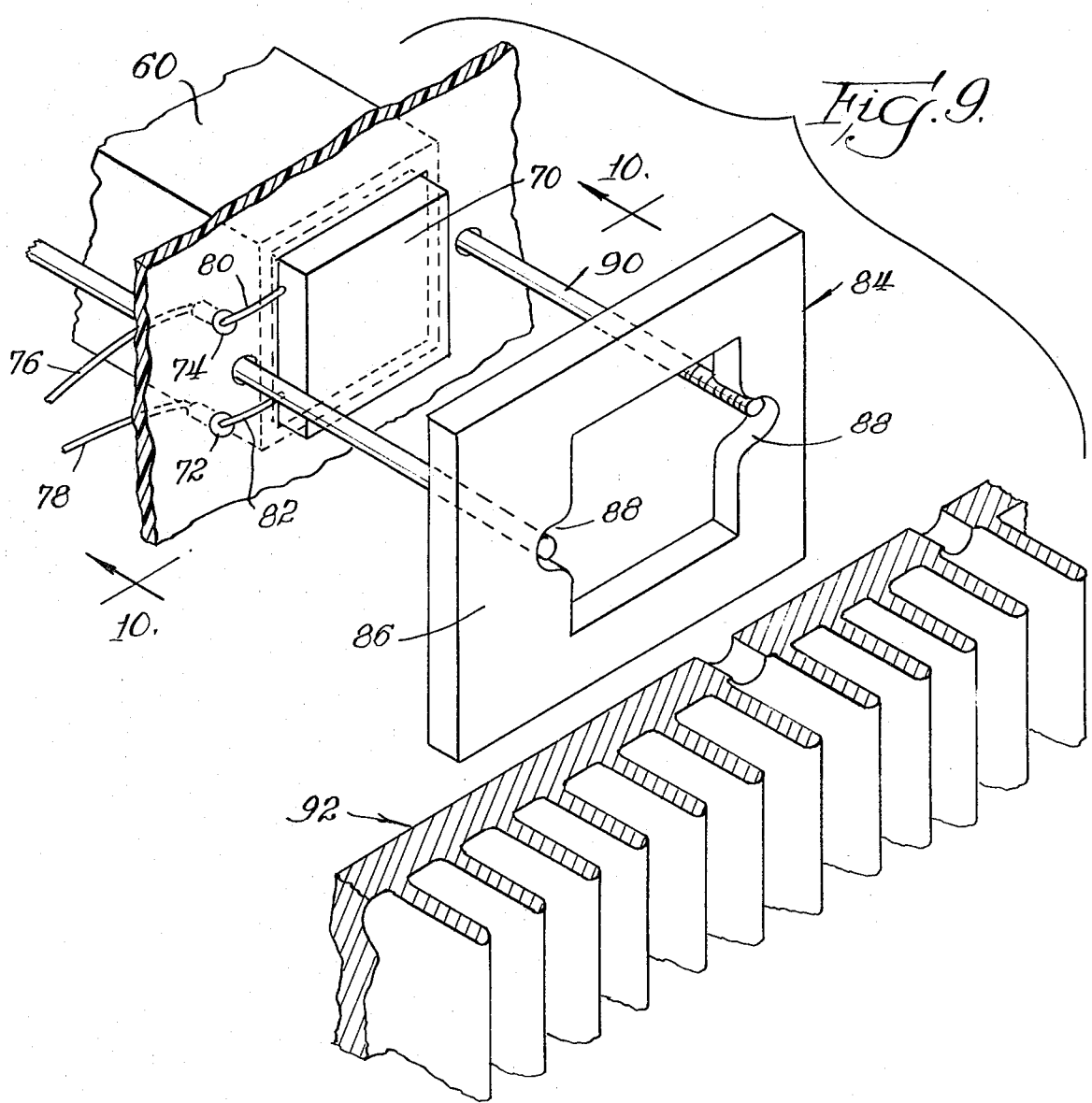

PELTIER REFRIGERATION CONSTRUCTION

BACKGROUND OF THE INVENTION

1. Field of the Invention

The invention relates to a refrigeration unit and to a process for making the same and is particularly directed to such units and process as are powered by a thermoelectric element.

2. Prior Art

Innumerable refrigerator or cooler units have been proposed, having innumerable configurations and arrangements of refrigeration or cooler cabinets, chambers, or compartments. Although previously-available types of refrigerator or cooler units have been generally acceptable for home and industrial use, they suffer from serious disadvantages when it is attempted to employ them in other environments. For example, in railroad trains, trucks, vans, buses and airplanes, where considerable vibration is ordinarily and expectedly encountered, and where space is at a premium, previously existing and proposed refrigeration or cooler units have numerous serious short-comings. For example, they take too much space initially, they are not rugged enough, they do not provide adequate cooling and they do not adequately withstand the expected vibrations and jarrings associated with these special environments.

It is eminently clear that a refrigerator or cooler unit which does not suffer from such serious disadvantages would be highly desirable and would fulfill a long-standing need in the art.

OBJECTS OF THE INVENTION

The invention has for an object the production of a novel refrigeration unit powered by a thermoelectric element of the peltier type and to a process for making the same. Another object is to provide a device of the class described rugged enough to withstand substantial shocks as would occur if the device were installed in a railroad car or like environment. Another object of the invention is to provide a thermal sink for a refrigeration unit of the class described. A further object of the invention is to provide a novel process for incorporating a thermoelectric device in the refrigeration unit of the class described. Another object of the invention is to avoid the disadvantages of the prior art and to obtain such advantages as will appear as the description proceeds.

SUMMARY OF THE INVENTION

The invention relates to refrigeration unit powered by a thermoelectric element of the Peltier type which comprises:

a box-shaped compartment having an open front, side walls formed of heat-conducting material and at least one end wall formed of a massive end plate of heat-conducting material, and a removable cover for closing the open front;

insulation material covering the walls and the cover to insulate the compartment from the ambient medium;

at least one integral protuberance projecting from each of the massive end plates through the insulation and terminating near the surface thereof in an exposed flat surface;

a thermoelectric element disposed on each flat surface with the cold face thereof in flat surface-to-surface contact therewith;

external thermal sink means in heat-transfer contact with the hot face of each thermoelectric element in stacked relation to the thermoelectric element; and, draw means for clamping each thermoelectric element between the flat surface with which the cold face is in flat surface-to-surface contact and the external thermal sink with which its hot face is in heat-exchange contact.

In accordance with preferred aspects of the refrigeration unit according to the invention, there may be incorporated one or more further features in which each said massive plate has at least three said integral protuberances, at least one each of which projects respectively through the insulation on each side wall and on the rear wall; in which the integral protuberances on one massive end plate are aligned with the integral protuberances on another massive end plate, the flat faces of each pair of aligned protuberances lie in a common plane, and the hot faces of the thermoelectric elements stacked thereon lie in a second common plane parallel to the first one; in which the hot faces which lie in said second common plane are in heat exchange with the same external thermal sink means; in which the side walls are formed of sheet-form material shaped in the form of a channel having outwardly-projecting flanges at the edges thereof along said open front and said flanges abut the edges of an aperture in a planar sheet-form material of a size and shape corresponding to the open front of said compartment; in which said massive end wall plates have flanges thereon which complement the flanges on said sheet-form material and which abut said planar sheet-form material along the edges of said aperture; which further comprises frame members which frame said aperture and the walls of said box-shaped compartment and extend beyond the outer surfaces of the insulation forming shallow compartments housing said cover and said external thermal sink means, and grill work covering said external thermal sinks, said cover being mounted in one of said compartments for movement to and away from said aperture; in which each said massive end plate comprises a planar face adapted to form the inner surface of an end wall of said box-shaped compartment which has channels or grooves conforming with the cross-section of said channel and adapted to receive said side walls to center said rectangular plates at the ends of said box-shaped compartment; in which each said massive end plate has an enlarged portion on the side opposite said planar face, portions of which form the laterally and rearwardly-projecting protuberances; in which one of the draw bolts for the external thermal sink means at the sides of said box-shaped compartment extends from one thermal sink means through an aperture in the rearwardly-projecting protuberance to a thermal sink means on the other side, and another passes along the forward side of said enlarged portion; in which the draw bolts for the external thermal sink means at the rear of said box-shaped compartment pass through that thermal sink means, are anchored to the laterally-projecting protuberances, or pass through and are anchored thereto; and in which said insulation material has a thin skin at the surface thereof which has a depression therein opposed to each said flat face and surrounding the thermoelectric element stacked on the exposed flat face therein, and in which said thin skin has electrical contact members projecting therethrough adjacent each said depression, the inner ends of which are connected to connecting wires imbedded in said insulation and the outer ends of which are connected to the hot and cold faces of the thermo-electric element disposed in said depression; which further comprises water-tight gasket means surrounding each said depression and compressed between the insulation and the thermal sink means opposed thereto, said gasket means extending all around the depression and overlying said contact points, thereby forming with said flat face, said insulation and said external thermal sink means, a water tight compartment enclosing said thermoelectric element and the electrical connections thereto.

The invention also relates to an internal thermal sink for a refrigeration unit of the class described which comprises a massive plate of heat-conducting material comprising a planar face having a channel or groove along and adjacent all but the front edge thereof and an upturned lip along the front edge thereof projecting away from said planar face, and an enlarged portion on the side opposite said planar face adapted to function as heat-transfer means for transferring heat from said planar face to said thermoelectric element.

Advantageously, the internal thermal sink according to the invention may be further characterized by one or more features in which the enlarged portion comprises protuberances which project laterally and rearwardly from the plate beyond the edges thereof, the protuberances terminating in flat surfaces which are normal to the plane of the planar face; in which each laterally-projecting protuberance has a bore therein which is parallel to and close to the sides of the rearwardly-projecting protuberance; and in which the rearwardly-projecting protuberance has a bore therein which is parallel to and close to the rear edges of the laterally-projecting protuberance.

The invention also relates to a process for making a refrigeration unit powered by a thermoelectric element of the Peltier type which comprises:

assembling a box-shaped compartment having an open front, side walls formed of heat-conducting material, and end walls formed of massive end plates of heat-conducting material; said massive plates comprising integral protuberances which terminate in flat faces normal to the end walls of said compartment;

applying to said walls insulation material including a surface layer of denser insulation material;

forming a depression in said insulation material which exposes the said flat face;

placing a thermoelectric element in said depression with the cold face thereof in flat surface-to-surface contact with said flat face;

placing an external thermal sink in heat-exchange with the hot face of said thermoelectric element; and, drawing said protuberance and said thermal sink together to place said thermoelectric element in compression therebetween to insure effective heat exchange.

In accordance with a preferred aspect of the process of the invention, there may be incorporated one or more further features in which a layer of denser insulation material is formed by disposing a thin layer of sheet-form insulation material on each said flat face and holding it there during the application of the insulation, and thereafter cutting said layer to form said depression and to expose said flat faces; in which a water-tight compressible gasket is placed around said depression and placed under compression when said drawing step is implemented; which further comprises bending sheet-form material into a channel, placing said massive plates on the open ends of said channel and centering them thereon by means of grooves or channels thereon corresponding to the cross-sectional shape of said channel, and fastening said plates thereto to form said box-shaped compartment;

forming a front member of planar sheet-form material with an aperture therein corresponding to the open front of said box-shaped compartment;

positioning said box-shaped compartment with its front edges abutting said front member around the aperture therein;

placing sheet-form thin insulating material against the flat faces of each said protuberance and then foaming insulation into the spaced formed by said sheet-form material and the walls of said compartment while keeping said sheet-form thin insulating material in contact with the flat face of said protuberance;

cutting away the sheet-form thin insulating material from the face of said protuberance to expose said flat face and to form a depression in the insulation material;

setting a thermoelectric element in the depression thus formed with its cold face in flat surface-to-surface contact with the thus exposed flat face of said protuberance, and which further comprises applying frame members to said box-shaped compartment to frame said external thermal sinks and applying grill work thereto to cover said sinks and yet allow the flow of ambient atmosphere to and from said sinks.

BRIEF DESCRIPTION OF THE DRAWINGS

In the drawings:

FIG. 1 is a front view in perspective.

FIG. 3 is a cross-sectional view taken long line 3—3 of FIG. 1;

FIG. 4 is a rear view of one of the thermal sinks of FIG. 2;

FIG. 5 is a partial section taken along line 5—5 of FIG. 3;

FIG. 6 is a partial section taken along line 6—6 of FIG. 3;

FIG. 7 is an isometric view of the frame shown in section in FIGS. 2 and 3;

FIG. 8 is a cross-section taken along line 8—8 of FIG. 2;

FIG. 9 is an exploded view of FIG. 8; and,

FIG. 10 is a view taken along line 10—10 of FIG. 9.

DESCRIPTION OF THE PREFERRED EMBODIMENTS

Figure 2:
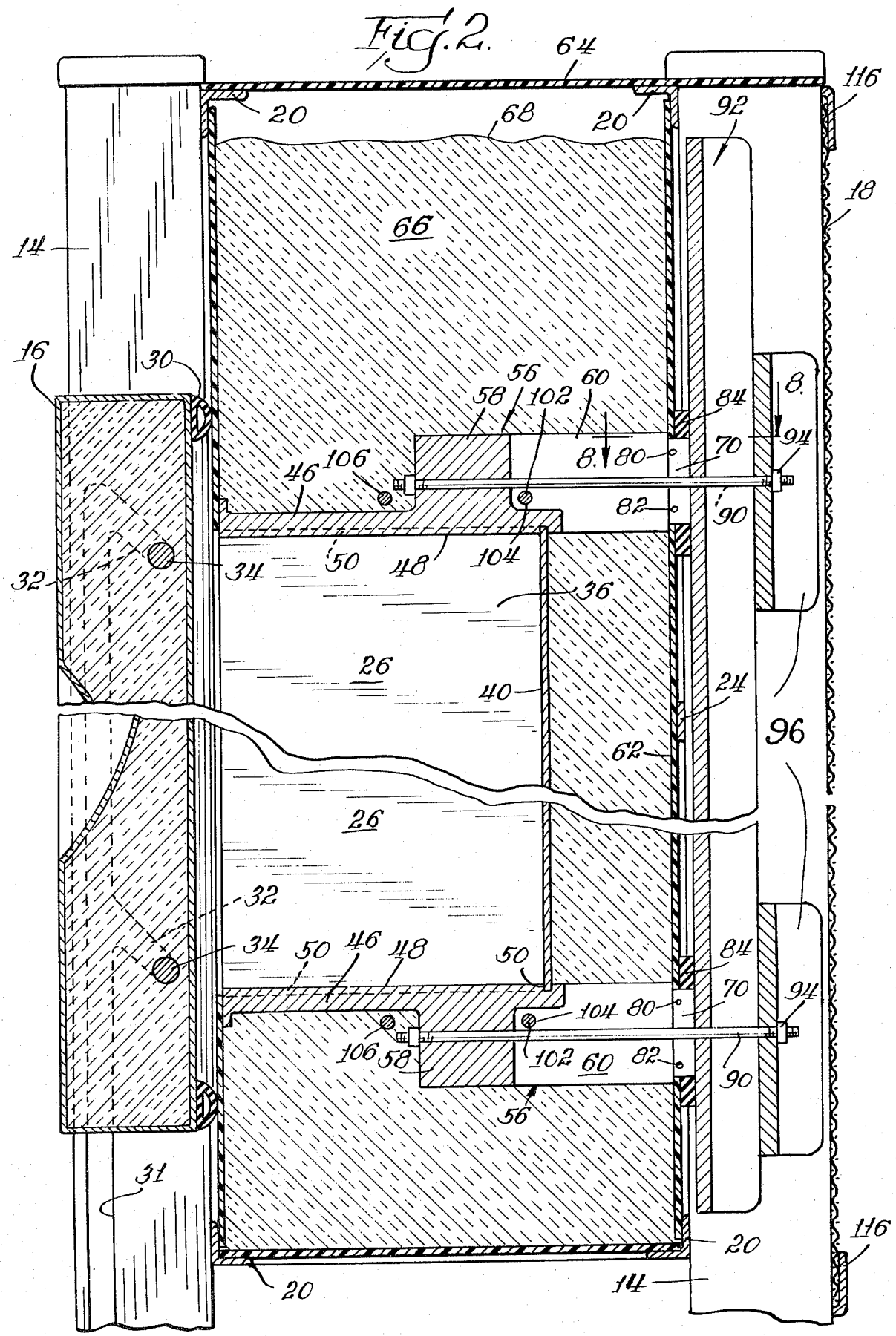
FIG. 2 is a cross-sectional view taken along line 2—2 of FIG. 1.

Referring particularly to FIG. 1, there is shown a refrigeration unit 10 according to the invention in which a refrigeration compartment is surrounded by a rectangular frame 12 which is supported by four upright legs or frame members 14. The compartment is provided with a door 16 which closes the compartment and the sides are covered by grillwork 18. The frame 12 is formed by angle pieces 20 welded together, as shown in FIG. 7, with crosspieces 22 and 24 at the rear for a purpose which will be described later. The frame 20 is welded or otherwise secured to the frame members 14, as shown more particularly in FIG. 3. The frame members 14 are hollow tubular members, rectangular in cross-section, which stand out from the frame 12 to form shallow compartments. The front shallow compartment receives the door or cover 16 and the shallow side compartments house the external thermal sinks or radiation devices as will be described hereinafter.

The door or cover 16 has a resilient gasket 30 of rubber or like material which seals the cover against the panel 28. The gasket 30 completely surrounds the opening in the panel.

The inner sides of the two front frame members 14 have slots in them which extend vertically, as shown at 31, along the front edge of the frame members and then angle back at an acute angle, as shown at 32, near the top and bottom of the cover 16. The cover has transverse pins 34 therein which extend into the slots, so that when the cover is raised, it is moved out by the acute angle slots 32 and can be dropped down the front slot 31 to expose the front opening in the box-like compartment 26.

The box-like compartment 26 is made of a sheet material bent in the form of a channel having sidewalls 36 and 38 and a rear wall 40. The sidewalls 36 and 38 are bent out to form lips at 42 and 44 which abut the front panel 28 around the opening therein. The tops and bottoms of the box-like compartment 26 is formed by massive plates 46 which have a planar inside face 48 which is fastened to the sidewalls 36 and 38 and rear wall 40.

The plates 46 have grooves therein, as shown at 50 and 52 to center the plates 46 on the walls 36, 38, and 40. These grooves may be close fitting, as shown in FIG. 5, or closely fitted to the inside of the walls 36, 38, and 40, as shown in FIG. 6.

The massive plates 46 comprise a portion 54 which is relatively thick and massive as compared with the walls 36, 38, and 40, so that they function as an effective thermal sink to absorb heat from the refrigeration compartment 26.

Adjacent the rear edge of the plate 54 is an enlarged portion 56 which, desirably, is several times as thick as the main body 54 of the plate 46.

The enlarged portion 56 extends transversely across the rear portion of the plate 46 and has laterally-extending protuberances 58 which extend beyond the sides thereof. It also has a rearwardly-extending protuberance extending beyond the rear edge thereof. The protuberances 58 and 60 are square-shaped in cross-section and terminate in square flat faces which are normal to the planar inside faces 48.

At the sides and rear of the frame 12 are sheet-form material 62, advantageously of insulating material which is relatively thin and dense. These sheets abut the inner faces of the angle pieces 20 and lie flat against the flat faces of the protuberances 58 and 60. The crosspieces 22 and 24 help to hold the sheet 62 against the flat faces of the rear protuberances and like crosspieces, not shown, can be provided, if desired, across the sides of the frame. Like sheet-form material 64 can be provided at the top and bottom of the frame 12 in a like manner.

The unit thus far constructed is placed in a press which firmly presses sheets from material 62 against the flat faces of the protuberances 58 and 60 and otherwise holds the top and bottom and sheets 64 and the front panel 28 against buckling during the placement of the insulation material. This is done by foaming in place a suitable foam, such as a polyurethane foam, and letting the foam rise up into the upper compartment 66 to a level shown at 68 or, if desired, all the way to the top sheet 64.

At this stage, the portion of the sheets 62 which abut the flat faces of the protuberances is cut away, as best seen in FIGS. 8, 9, and 10, to provide a depression to receive the thermoelectric elements 70, also as best seen in these same figures. If desired, however, the sheets 62 can be pre-cut to form these depressions. This allows the thermoelectric elements 70 to be disposed on the flat face of the protuberances in surface-to-surface contact to provide good heat exchange between the protuberances and the cold face of the thermoelectric elements 70. The depressions thus formed assure that the cold face of the thermoelectric element 70 is essentially encased by the insulation material, whereas the hot face thereof is not. This is assured by the fact that the sheet 62 is thinner than the thickness of the thermoelectric element 70.

Adjacent to the depression thus formed are contact elements or points 72 and 74 extending through the sheet-form material 62 into the insulating material where they are connected to electrical lead lines 76 and 78 which in turn are connected to a source of direct current power, not shown. The outer portions of the contact points 72 and 74 are connected by lead lines 80 and 82 to the thermoelectric element 70 in order to give the necessary polarity across the cold and hot faces thereof. Now, a resilient, water-tight gasket 84 is placed around the element 70 with an enlarged portion 86 which completely overlies the contact points 72 and 74 so that the thermoelectric element is completely surrounded and the contact points are completely encased by the gasket. The gasket 84 has cut-outs 88 to receive the tie bolts 90 which extend through the laterally-extending protuberances 58 and are fastened to the front faces thereof by suitable fasteners, such as the nuts 94. If desired, the tie rods 90 can be anchored in the laterally-extending protuberances by being threaded or otherwise fastened thereto.

A suitable external thermal sink or radiating device 92 is placed over the tie bolts and seated on the gasket 84. The external thermal sink 92 is then drawn down tight by suitable nuts 94 so that the thermal sink is in hot surface-to-surface contact with the outer face of the thermoelectric element 70. In the form shown, a second external thermal sink or radiating device 96 is stacked on the first and the nuts 94 drawn tight on it instead of on the first.

The side construction is essentially the same in that the sheet-form material 62 is cut out to expose the flat faces of the laterally-extending protuberances and the thermoelectric elements placed thereon surrounded by a resilient gasket and the radiating devices or thermal sinks are drawn tight thereon in exactly the same manner. The only difference is that the tie rods in this case, extend all the way from one thermal sink to the thermal sink on the opposite side, for example, from the side external thermal shallow sink 98 to the side external thermal sink 100. The tie rod 102 extends through an aperture 104 in rearwardly-projecting protuberance 60, whereas the other tie rod 106 extends along the inner or front face of the protuberances 58 and the enlarged portion 56. Both thermal sinks 98 and 100 are drawn together by the nuts 108 into effective heat exchange contact surface-to-surface with the hot faces of the thermoelectric elements 110 and 112 in exactly the same manner described in connection with FIGS. 8 and 9.

The external thermal sinks are shaped to occupy the shallow compartments formed by the frame members 14 and are protected by a grillwork 18 which is secured to the frame members 14 by suitable frame members 116.

If desired, the top of these compartments can be left open as well as the bottoms, thereby giving rise to an updraft which promotes radiation or loss of heat from the external thermal sinks by convection. For this purpose, the fins on the external thermal sinks are vertically-oriented and parallel to the frame members 14 to promote the updraft. Even if the top portions are closed, as shown in FIG. 2, there still is ample updraft because there is ample opportunity for the updraft to vent itself through the grill work 18.

It is to be understood that the invention is not to be limited to the exact details of construction, operation, or exact materials or embodiments shown and described, as obvious modifications and equivalents will be apparent to one skilled in the art, and the invention is therefore to be limited only by the full scope of the appended claims.

I claim:

1. A refrigeration unit powered by a thermoelectric element of the Peltier type which comprises:
   a box-shaped compartment having an open front, side walls formed of heat-conducting material and at least one end wall formed of a massive end plate of heat-conducting material, and a removable cover for closing said open front;
   insulation material covering said walls and said cover to insulate said compartment from the ambient medium;
   at least one integral protuberance projecting from each of said massive end plates through said insulation and terminating near the surface thereof in an exposed flat surface;
   a thermoelectric element stacked on each said flat surface with the cold face thereof in flat surface-to-surface contact therewith;
   external thermal sink means in heat-transfer contact with the hot face of each said thermoelectric element in stacked relation to said thermoelectric element; and
   draw means for clamping each said thermoelectric element between the flat surface with which the cold face is in flat surface-to-surface contact and the external thermal sink means with which its hot face is in heat-exchange contact.

2. A refrigeration unit according to claim 1, in which an integral protuberance on one massive end plate is aligned with an integral protuberance on another massive end plate, the flat faces of the aligned integral protuberances lie in a common plane, and the hot faces of the thermoelectric elements stacked thereon lie in a second common plane parallel to the first one.

3. A refrigeration unit according to claim 2, in which the hot faces which lie in said second common plane are in heat exchange with the same external thermal sink means.

4. A refrigeration unit according to claim 3, which further comprises frame members forming shallow channels for housing said cover and said external thermal sink means, and grill means covering said external thermal sink means, one said cover being mounted in one said channel for movement to and away from said aperture.

5. A refrigeration unit according to claim 1, which further comprises frame members which frame said aperture ane the walls of said box-shaped compartment and extend beyond the outer surfaces of the insulation forming shallow compartments housing said cover and said external thermal sink means, and grill work covering said external thermal sinks, said cover being mounted in one of said compartments for movement to and away from said aperture.

6. A refrigeration unit according to claim 1, in which the side walls are formed of sheet-form material shaped in the form of a channel having outwardly-projecting flanges at the edges thereof along said open front and said flanges abut the edges of an aperture in a planar sheet-form material of a size and shape corresponding to the open front of said compartment.

7. A refrigeration unit according to claim 6, in which said massive end wall plates have flanges thereon which complement the flanges on said sheet-form material and which abut said planar sheet-form material along the edges of said aperture.

8. A refrigeration unit according to claim 1, in which each said massive plate has at least three said integral protuberances, at least one each of which projects respectively through the insulation on each side wall and on the rear wall.

9. A refrigeration unit according to claim 8, in which the integral protuberances on one massive end plate are aligned with the integral protuberances on another massive end plate, the flat faces of each pair of aligned protuberances lie in a common plane, and the hot faces of the thermoelectric elements stacked thereon lie in a second common plane parallel to the first one.

10. A refrigeration unit according to claim 9, in which the hot faces which lie in said second common plane are in heat exchange with the same external thermal sink means.

11. A refrigeration unit according to claim 10, which further comprises frame members which frame said aperture and the walls of said box-shaped compartment and extend beyond the outer surfaces of the insulation forming shallow compartments, one of which houses said cover and the others of which house external thermal sinks, and grill means covering said external thermal sink means, said cover being mounted in one of said compartments for movement to and away from said aperture.

12. A refrigeration unit according to claim 1, in which each said massive end plate comprises a planar face adapted to form the inner surface of an end wall of said box-shaped compartment which has channels or grooves conforming with the cross-section of said channel and adapted to receive said side walls to center said rectangular plates at the ends of said box-shaped compartment.

13. A refrigeration unit according to claim 12, in which each said massive end plate has an enlarged portion on the side opposite said planar face, portions of which form the laterally and rearwardly projecting protuberances.

14. A refrigeration unit according to claim 13, in which one of the draw bolts for the external thermal sink means at the sides of said box-shaped compartment extends from one thermal sink means through an aperture in the rearwardly-projecting protuberance to a thermal sink means on the other side, and another passes along the forward side of said enlarged portion.

15. A refrigeration unit according to claim 13, in which the draw bolts for the external thermal sink means at the rear of said box-shaped compartment pass through that thermal sink means and are anchored to the laterally-projecting protuberances.

16. A refrigeration unit according to claim 14, in which the draw bolts for the external thermal sink means at the rear of said box-shaped compartment pass through that thermal sink means, through the laterally-projecting protuberances, and are anchored on the forward side thereof.

17. A refrigeration unit according to claim 1, in which said insulation material has a thin skin at the surface thereof which has a depression therein opposed to each said flat face and surrounding the thermoelectric element stacked on the exposed flat face therein.

18. A refrigeration unit according to claim 17, in which said thin skin has electrical contact members projecting therethrough adjacent each said depression, the inner ends of which are connected to connecting wires imbedded in said insulation and the outer ends of which are connected to the hot and cold faces of the thermoelectric element disposed in said depression.

19. A refrigeration unit according to claim 18, which further comprises water-tight gasket means surrounding each said depression and compressed between the insulation and the thermalsink means opposed thereto, said gasket means extending all around the depression and overlying said contact points, thereby forming with said flat face, said insulation and said external thermal sink means, a water tight compartment enclosing said thermoelectric element and the electrical connections thereto.

20. A refrigeration unit according to claim 1, in which each said massive plate has at least three said integral protuberances, at least one each of which projects respectively through the insulation on each side wall and on the rear wall; in which the integral protuberances on one massive end plate are aligned with the integral protuberances on the other massive end plate, the flat faces of each pair of aligned protuberances lie in a common plane, and the hot faces of the thermoelectric elements stacked thereon lie in a second common plane parallel to the first one; in which the hot faces which lie in said second common plane are in heat exchange with the same external thermal sink means; in which said sheet-form material is shaped in the form of a channel having outwardly-projecting flanges at the edges thereof along said open front and said flanges abut the edges of an aperture in a planar sheet-form material of a size and shape corresponding to the open front of said compartment; in which said massive end wall plates have flanges thereon which complement the flanges on said sheet-form material and which abut said planar sheet-form material along the other edges of said aperture; which further comprises frame members which frame said aperture and the walls of said box-shaped compartment and extend beyond the outer surfaces of the insulation forming shallow compartments housing said cover and said external thermal sink means, and grill work covering said external thermal sinks, said cover being mounted in one of said compartments for movement to and away from said aperture; in which each said massive end plate comprises a planar face adapted to form the inner surface of an end wall of said box-shaped compartment which has channels or grooves conforming with the cross-section of said channel and adapted to receive said side walls to center said rectangular plates at the ends of said box-shaped compartment; in which each said massive end plate has an enlarged portion on the side opposite said planar face, portions of which form the laterally and rearwardly-projecting protuberances; in which one of the draw bolts for the external thermal sink means at the sides of said box-shaped compartment extends from one thermal sink means through an aperture in the rearwardly-projecting protuberance to a thermal sink means on the other side, and another passes along the forward side of said enlarged portion; in which the draw bolts for the external thermal sink means at the rear of said box-shaped compartment pass through that thermal sink means, through the laterally-projecting protuberances, and are anchored thereto; and in which said insulation material has a thin skin at the surface thereof which has a depression therein opposed to each said flat face and surrounding the thermoelectric element stacked on the exposed flat face therein.

21. A refrigeration unit according to claim 20, in which said thin skin has electrical contact members projecting therethrough adjacent each said depression, the inner ends of which are connected to connecting wires imbedded in said insulation and the outer ends of which are connected to the hot and cold faces of the thermoelectric element disposed in said depression; which further comprises water-tight gasket means surrounding each said depression and compressed between the insulation and the thermal sink means opposed thereto, said gasket means extending all around the depression and overlying said contact points, thereby forming with said flat face, said insulation and said external thermal sink means, a water tight compartment enclosing said thermoelectric element and the electrical connections thereto.

22. An internal thermal sink for a refrigeration unit powered by a thermoelectric element of the Peltier type which comprises a massive plate of heat-conducting material comprising a planar face having a channel or groove along and adjacent all but the front edge thereof and an upturned lip along the front edge thereof projecting away from said planar face, and an enlarged portion on the side opposite said planar face adapted to function as heat-transfer means for transferring heat from said planar face to said thermoelectric element.

23. An internal thermal sink according to claim 22, in which said enlarged portion comprises protuberances which project laterally and rearwardly from said plate beyond the edges thereof, said protuberances terminating in flat surfaces which are normal to the plane of said planar face.

24. An internal thermal sink according to claim 23, in which each of the laterally-projecting protuberances has a bore therein which is parallel to and close to the sides of the rearwardly-projecting protuberance.

25. An internal thermal sink according to claim 23, in which the rearwardly-projecting protuberance has a bore therein which is parallel to and close to the rear edges of the laterally-projecting protuberance.

26. An internal thermal sink according to claim 24, in which each of the laterally-projecting protuberances has a bore therein which is parallel to and close to the sides of the rearwardly-projecting protuberance.

27. A process for making a refrigeration unit powered by a thermoelectric element of the Peltier type which comprises:
    assembling a box-shaped compartment having an open front, side walls formed of heat-conducting material, and end walls formed of massive end plates of heat-conducting material; said massive plates comprising integral protuberances which terminate in flat faces normal to the end walls of said compartment;
    applying to said walls insulation material including a surface layer of denser insulation material;
    forming a depression in said insulation material which exposes the said flat face;

placing a thermoelectric element in said depression with the cold face thereof in flat surface-to-surface contact with said flat face;

placing an external thermal sink in heat-exchange with the hot face of said thermoelectric element; and, drawing said protuberance and said thermal sink together to place said thermoelectric element in compression therebetween to insure effective heat exchange.

28. A process of claim 25, in which said layer of denser insulation material is formed by disposing a thin layer of sheet-form insulation material on each said flat face and holding it there during the application of the insulation, and thereafter cutting said layer to form said depression and to expose said flat faces.

29. A process of claim 26, in which a water-tight compressible gasket is placed around said depression and placed under compression when said drawing step is implemented.

30. A process of claim 29, which further comprises applying frame members to said box-shaped compartment to frame said external thermal sinks and applying grill work thereto to cover said sinks and yet allow the flow of ambient atmosphere to and from said sinks.

31. A process of claim 27, which further comprises bending sheet-form material into a channel, placing said massive plates on the open ends of said channel and centering them thereon by means of grooves or channels thereon corresponding to the cross-sectional shape of said channel, and fastening said plates thereto to form said box-shaped compartment;

forming a front member of planar sheet-form material with an aperture therein corresponding to the open front of said box-shaped compartment;

positioning said box-shaped compartment with its front edges abutting said front member around the aperture therein;

placing sheet-form thin insulating material against the flat faces of each said protuberance and then foaming insulation into the spaced formed by said sheet-form material and the walls of said compartment while keeping said sheet-form thin insulating material in contact with the flat face of said protuberance;

cutting away the sheet-form thin insulating material from the face of said protuberance to expose said flat face and to form a depression in the insulation material;

setting a thermoelectric element in the depression thus formed with its cold face in flat surface-to-surface contact with the thus exposed flat face of said protuberance.

32. A process of claim 31, in which said layer of denser insulation material is formed by disposing a thin layer of sheet-form insulation material on each said flat face and holding it there during the application of the insulation, and thereafter cutting said layer to form said depression and to expose said flat faces.

33. A process of claim 32, in which a water-tight compressible gasket is placed around said depression and placed under compression when said drawing step is implemented.

34. A process of claim 33, which further comprises applying frame members to said box-shaped compartment to frame said external thermal sinks and applying grill work thereto to cover said sinks and yet allow the flow of ambient atmosphere to and from said sinks.

* * * * *